(12) United States Patent
Tomohiro et al.

(10) Patent No.: US 9,093,626 B2
(45) Date of Patent: Jul. 28, 2015

(54) LUMINESCENCE DEVICE

(71) Applicant: LG INNOTEK CO., LTD., Seoul (KR)

(72) Inventors: Sampei Tomohiro, Seoul (KR); Kato Takuma, Seoul (KR); Matsuda Shuhei, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/010,592

(22) Filed: Aug. 27, 2013

(65) Prior Publication Data

US 2014/0097452 A1   Apr. 10, 2014

(30) Foreign Application Priority Data

Oct. 9, 2012   (KR) .................. 10-2012-0111596

(51) Int. Cl.
| | | |
|---|---|---|
| *H01L 33/00* | (2010.01) | |
| *H01L 33/56* | (2010.01) | |
| *H01L 25/075* | (2006.01) | |
| *H01L 33/64* | (2010.01) | |
| *H01L 27/15* | (2006.01) | |
| *H01L 33/62* | (2010.01) | |

(52) U.S. Cl.
CPC ............ *H01L 33/56* (2013.01); *H01L 25/0753* (2013.01); *H01L 27/15* (2013.01); *H01L 33/641* (2013.01); *H01L 33/62* (2013.01); *H01L 2224/48091* (2013.01)

(58) Field of Classification Search
CPC ......... H01L 33/60; H01L 33/20; H01L 33/62; H01L 33/54
USPC ............................................... 257/98, 99, 100
See application file for complete search history.

(56) References Cited

U.S. PATENT DOCUMENTS

| 6,674,159 | B1 * | 1/2004 | Peterson et al. ............. 257/680 |
| 7,800,124 | B2 * | 9/2010 | Urano et al. .................... 257/98 |
| 7,943,952 | B2 * | 5/2011 | Loh et al. ...................... 257/100 |
| 8,735,920 | B2 * | 5/2014 | Ibbetson et al. ............... 257/98 |

* cited by examiner

*Primary Examiner* — Quoc Hoang
(74) *Attorney, Agent, or Firm* — Ked & Associates, LLP

(57) ABSTRACT

A luminescence device used in a backlight unit for lighting or displaying may include: a substrate including at least two electrode patterns and LED chips which are provided over the substrate and include a phosphor provided thereon. A dam is provided over the substrate, and an encapsulation layer is provided over the substrate. The dam is spaced from the LED Chips, and the substrate comprises a direct copper bonding (DCB) substrate including a first copper layer, a second copper layer and a substrate body.

20 Claims, 2 Drawing Sheets

LUMINESCENCE DEVICE

CROSS-REFERENCE TO RELATED APPLICATION

The present application claims priority under 35 U.S.C. §119(e) of Korean Patent Application No. 10-2012-0111596 filed on Oct. 9, 2012, which is hereby incorporated by reference in its entirety.

BACKGROUND

1. Field

This embodiment relates to a luminescence device used in a backlight unit for lighting or displaying.

2. Description of Related Art

Here, related arts to this embodiment will be provided and has not necessarily been publicly known.

A light emitting device (LED) is a semiconductor device for converting electric energy into light. As compared with an existing light source, for example, a fluorescent lamp, an incandescent lamp and the like, the LED has low power consumption, a semi-permanent lifespan, a rapid response speed, safety, environmental friendliness. For these reasons, many researches are devoted to substitution of the existing light sources with the LED. The LED is now increasingly used as a light source for lighting devices, for example, various lamps used interiorly and exteriorly, a liquid crystal display device, an electric sign and a street lamp and the like.

Generally, a luminescence device using the LED includes two electrode patterns which is disposed on a substrate, a mold housing which receives a portion of the electrode pattern in the inside thereof and is injection-molded such that a cavity is formed to function as a filling space of a light transmitter, a heat sink layer which is disposed on the electrode pattern in the cavity, an LED chip which is disposed on the heat sink layer, and a bonding wire which electrically connects the electrode pattern and the LED chip. Here, the light transmitter seals the LED chip by filling the cavity. Depending on the color of the LED chip to be implemented, the light transmitter may include a phosphor or may be formed of a transparent resin.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

Figure 1:
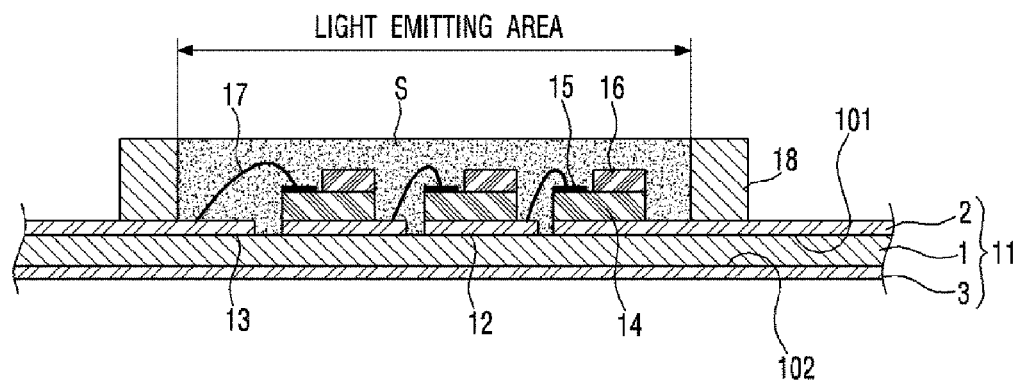
FIG. 1 is a cross sectional view of a luminescence device according to a first embodiment.

FIG. 1 is a cross sectional view of a luminescence device according to a first embodiment. With reference to FIG. 1, the structure of the luminescence device according to the first embodiment will be described.

As shown in FIG. 1, the luminescence device according to the first embodiment may include a direct copper bonding (DCB) substrate 11, an LED chip 14, a phosphor 16, a bonding wire 17, a dam 18 and an encapsulation layer "S".

The DCB substrate 11 may include a substrate body 1, a first copper layer 2 and a second copper layer 3.

The substrate body 1 may be formed of at least any one of a ceramic material, a polymer material, a resin material, a silicon material and the like or by any combination of them and may have a front side 101 and a rear side 102 facing the front side 101. The front side 101 and the rear side 102 form the outer surface of the substrate body 1 respectively. If an outer surface of the substrate body 1 is the front side 101, the other outer surface facing the front side 101 may be the rear side 102.

Besides the above-mentioned material of the substrate body 1, any material capable of functioning as an insulation layer and a body of the DCB substrate 11 can be used as the material of the substrate body 1. For example, $Al_2O_3$, ALN, BeO and the like may be used as the material of the substrate body 1.

The first copper layer 2 may be disposed on the front side 101 of the substrate body 1. The second copper layer 3 may be disposed on the rear side 102 of the substrate body 1. An electrode pattern may be formed on the first copper layer 2 by mask-etching a certain circuit pattern. Therefore, the first copper layer 2 may include a plurality of the electrode patterns. Here, the plurality of the electrode patterns may be a first electrode pattern 12 and a second electrode pattern 13. Although it has been shown that the first and the second electrode patterns 12 and 13 are included in the luminescence device according to the first embodiment, the number of the electrode patterns is not necessarily limited to this. The number of the electrode patterns may be increased according to the number of the LED chips. Also, the electrode patterns are disposed on the first copper layer 2.

The substrate body 1 may have a thickness of 0.2 to 0.32 mm. Also, the first copper layer 2 and the second copper layer 3 may have a thickness of 0.15 to 0.25 mm respectively. Also, the electrode patterns may be formed to electrically isolated from each other in consideration of heat radiation of the LED chip 14 or junction of the LED chip 14. The electrode patterns may be separated from each other by a distance within a range of 0.25 to 0.4 mm.

Though the luminescence device according to the first embodiment uses the DCB substrate, the luminescence device is not limited to this. A substrate on which at least two electrode patterns have been formed may be used.

A driving circuit (not shown) for driving the LED chip 14 may be mounted. The driving circuit (not shown) may function to drive the LED chip 14 so as to perform functions according to the purpose and use of the luminescence device.

The DCB substrate 11 is a thermally conductive substrate. The DCB substrate 11 may radiate to the outside the heat generated from the LED chip 14. For the purpose of performing the function, the DCB substrate 11 may include the first and the second copper layers 2 and 3.

Although the first and the second copper layers 2 and 3 are shown in the embodiment, it is also allowed that the first and the second copper layers 2 and 3 are formed of another metal layer. For example, the first and the second copper layers 2 and 3 may be formed of a metal layer formed of at least any one selected from the group consisting of Ag, Au, Ni, Al, Cr, Ru, Re, Pb, Sn, In, Zn, Pt, Mo, Ti, Ta, W, etc., or may be formed of an alloy layer formed of the above-described metallic materials.

The first and second electrode patterns 12 and 13 may be comprised of electrodes for electrically connecting to the LED chip 14. Also, the first and second electrode patterns 12 and 13 may be patterned in such a manner as to be electrically connected to the driving circuit for driving the LED chip 14. The first and second electrode patterns 12 and 13 may perform a function of an electric wire connecting the components within the luminescence device. Therefore, the first and second electrode patterns 12 and 13 may be composed of an anode electrode and a cathode electrode for driving the LED chip 14. The LED chip 14 may be mounted on the first electrode pattern 12, and the second electrode pattern 13 may be electrically connected to an electrode pad 15 of the LED chip 14.

The LED chip 14 is a light emitting means. The LED chip 14 may be mounted on a predetermined area of the each first electrode pattern 12. Also, a metal layer may be formed on the top surface of the first electrode pattern 12, and the LED chip 14 may be disposed on the metal layer. Here, the metal layer may include Au.

The LED chip 14 is a kind of light emitting means to emit light. The LED chip 14 may be one of a colored LED chip and an UV LED chip. The colored LED chip may be formed in the form of a package obtained by combining at least one or more of a blue LED chip, a red LED chip, a green LED chip, a yellow green LED chip and a white LED chip. At least one LED chip 14 is mounted in a certain area of the DCB substrate 11, so that the area in which the LED chips 14 are mounted is a light emitting area. More specifically, the LED chip 14 may be mounted in a certain area on the first electrode pattern 12 of the DCB substrate 11.

Also, the LED chip 14 may include the electrode pad 15. The electrode pad 15 may be formed in a predetermined area of the top surface of the LED chip 14 in a direction in which the second electrode pattern 13 is disposed.

The number of the LED chips 14 is not limited to the number shown in the drawing and may be increased according to the use of the luminescence device. The LED chip 14 may be a vertical type chip, lateral type LED chip and flip type chip. The type of the LED chips 14 is not limited to the type shown in the drawing.

Continuously, the bonding wire 17 may be bonded to the second electrode pattern 13 and the electrode pad 15 of the LED chip 14 mounted on the first electrode pattern 12 respectively. Thus, the second electrode pattern 13 and the electrode pad 15 of the LED chip 14 mounted on the first electrode pattern 12 may be electrically connected to each other through the bonding wire 17. The bonding wire 17 may be formed of a material having an excellent electrical conductivity, e.g., Au, Ag and the like.

The phosphor 16 may be disposed adjacent to the electrode pad 15 on the LED chip 14. Here, the phosphor 16 may include at least one kind of the phosphor.

The phosphor 16 may function to excite light emitted from the LED chip 14. For example, the phosphor 16 may include at least one of a silicate based phosphor, a sulfide based phosphor, a YAG based phosphor, a TAG based phosphor and a nitride based phosphor.

The dam 18 is made of an insulation material. That is, the dam 18 is an insulation material. The dam 18 may be disposed on the DCB substrate 11 outside the first and the second electrode patterns 12 and 13. The dam 18 may be formed taller than the LED chip 14. The dam 18 may have a variety of shapes. For example, the dam 18 may have any one of shapes of a hemisphere, a semi-ellipse, a semi-circle, a quadrangle and a quadrangle having an upper chamfered edge.

The encapsulation layer "S" may be formed in a space formed by the dam 18 and the first and the second electrode patterns 12 and 13. The encapsulation layer "S" may include a light-transmitting protective resin. For example, the encapsulation layer "S" may be made of a silicone resin or an epoxy resin, each of which includes a phosphor. Encapsulation layer "S" may be disposed on the substrate. Also, encapsulation layer "S" may be disposed on the LED chip 14.

Reference light generated from the LED chip 14 may travel upward. In a portion adjacent to the surface of the LED chip 14, the reference light may be mixed with secondary excited light which is absorbed by the phosphor injected into the encapsulation layer "S" and is re-emitted. Accordingly, the reference light may be represented by a white color. Here, since the deviation and uniformity difference of the color are caused depending on the shape of the encapsulation layer "S" into which the phosphor has been injected, the encapsulation layer "S" may be formed flat.

As described above, since the luminescence device according to the first embodiment includes the DCB substrate 11 and the LED chip 14 mounted on the DCB substrate 11, the LED chip 14 is directly mounted on the DCB substrate 11 without both the electrode pattern disposed separately from the substrate and the heat sink layer disposed on the electrode pattern, so that the height of the luminescence device can be reduced.

Figure 2:
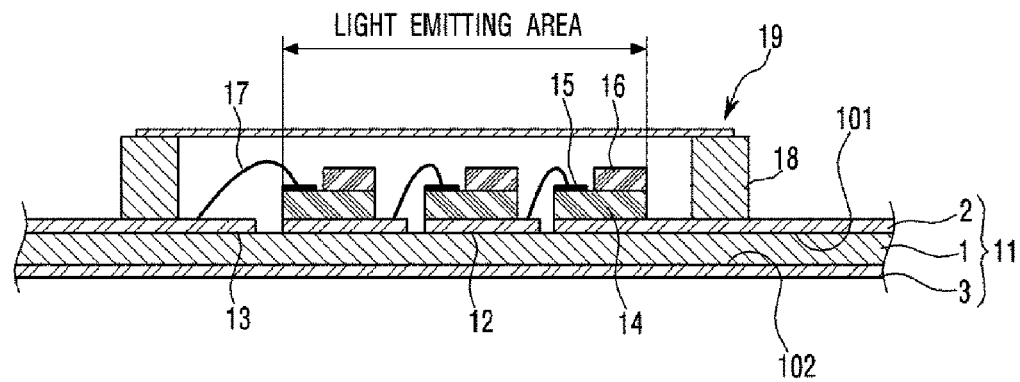
FIG. 2 is a cross sectional view of a luminescence device according to a second embodiment.

FIG. 2 is a cross sectional view of a luminescence device according to a second embodiment.

Referring to FIG. 2, the luminescence device according to the second embodiment may include the DCB substrate 11, the LED chip 14, the phosphor 16, the bonding wire 17, the dam 18 and a reflection preventing glass 19.

Since the configuration of the substrate 11, the LED chip 14, the bonding wire 17 and the dam 18 is the same as that of the foregoing first embodiment, a detailed description thereof will be omitted.

The phosphor 16 may be disposed adjacent to the electrode pad 15 on the LED chip 14. Here, the phosphor 16 may include at least one kind of the phosphor.

The phosphor 16 functions to excite light emitted from the LED chip 14. For example, the phosphor 16 may include at least one of a silicate based phosphor, a sulfide based phosphor, a YAG based phosphor, a TAG based phosphor and a nitride based phosphor.

Different kinds and amounts of the phosphors 16 may be included in accordance with the LED chip 14. For example, when the LED chip 14 emits white light, the phosphor 16 may include a green phosphor and a red phosphor. Further, when the LED chip 14 emits blue light, the phosphor 16 may include a green phosphor, a yellow phosphor and a red phosphor.

The reflection preventing glass 19 may be disposed above the first and the second electrode patterns 12 and 13 and on the dam 18 in parallel with the DCB substrate 11. The reflection preventing glass 19 may be spaced from the phosphor 16. The reflection preventing glass 19 may be a film.

The reflectance of the reflection preventing glass 19 is less than that of a resin. Therefore, the reflection preventing glass 19 is able to reduce a light emitting area by suppressing light diffusion. For instance, the light emitting area for 30 LED chips 14 may be 140 mm².

Figure 3:
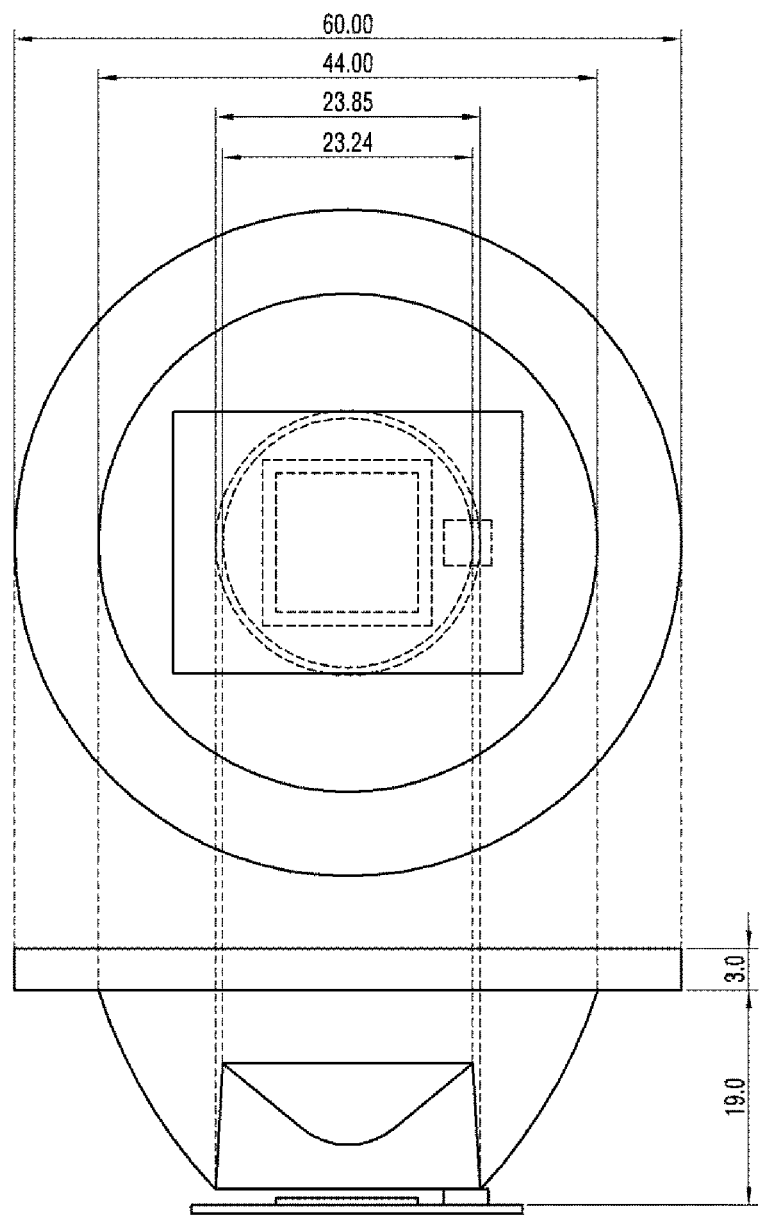
FIG. 3 is a schematic view showing a luminescence device in which an LED chip and a lens of FIG. 2 are coupled to each other.

FIG. 3 is a schematic view showing a luminescence device in which an LED chip of FIG. 2 and a lens are coupled to each other.

As described above, since the luminescence device according to the second embodiment includes the DCB substrate 11 and the LED chip 14 mounted on the DCB substrate 11, the LED chip 14 is directly mounted on the DCB substrate 11 without including the electrode pattern disposed separately from the substrate and the heat sink layer disposed on the electrode pattern. Accordingly, the height of the luminescence device can be reduced.

Further, the luminescence device includes the phosphor 16 disposed on the LED chip 14, thereby reducing the area of the luminescence device and improving the luminance of the luminescence device.

Moreover, the luminescence device includes the reflection preventing glass 19, thereby suppressing the light diffusion and reducing the light emitting area.

That is to say, referring to FIG. 3 and the following table 1, in the comparison of the luminescence device with Edison, the height, outer diameter, effective diameter, field angle, etc., are reduced from 44.2 mm to 22 mm, 87 mm to 60 mm, 70 mm to 44 mm and 60° to 58° respectively. Here, the luminescence device includes, as shown in FIG. 3, a lens Inner and outer diameters of the inner surface of the lens are 23.24 mm and 23.85 mm respectively.

TABLE 1

|  | Edison | embodiment |
|---|---|---|
| light emitting area of COB (mm) | 23 | 11.8 |
| height (mm) | 44.2 | 22 |
| outer diameter (mm) | 87 | 60 |
| effective diameter (mm) | 70 | 44 |
| field angle (°) | 60 (medium angle) | 58 (medium angle) |
| beam angle (°) |  | 33 |
| geometrical efficiency |  | 96.4 |

Moreover, the luminescence device uses Au as the metal layer of the substrate, to thereby restraining the emitted light from being discolored. The luminescence device is hereby able to inhibit the degradation of luminous flux. That is, since the luminescence device includes the phosphor 16 disposed on the LED chip 14 and the reflection preventing glass 19 disposed apart from the phosphor 16, little light reaches the first and the second electrode patterns 12 and 13, and thus, Au with a low reflectance can be used as the metal layer of the substrate.

One embodiment is a luminescence device. The luminescence device includes: a substrate including at least two electrode patterns; LED chips which are disposed on the substrate and include a phosphor disposed thereon; a dam disposed on the substrate; and an encapsulation layer disposed on the substrate, wherein the dam is disposed spaced from the LED Chips, and wherein the substrate comprises a direct copper bonding (DCB) substrate including a first copper layer, a second copper layer and a substrate body.

Another embodiment is a luminescence device. The luminescence device includes: a substrate including at least two electrode patterns; LED chips which are disposed on the substrate and include a phosphor disposed thereon; a dam disposed on the substrate; and a reflection prevention unit disposed above the substrate and on the dam and spaced from the LED chips.

Another embodiment is a luminescence device. The luminescence device includes: a substrate including at least two electrode patterns; LED chips which are disposed on the substrate and include a phosphor disposed thereon; a dam disposed on the substrate; an encapsulation layer disposed on the substrate; and a film disposed above the substrate and on the dam and spaced from the LED chips, wherein the dam is disposed spaced from the LED Chips, and wherein the substrate comprises a direct copper bonding (DCB) substrate including a first copper layer, a second copper layer and a substrate body.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A luminescence device comprising:
   a substrate including
      a substrate body including a top surface and a bottom surface,
      a first metal layer disposed on the top surface and including a first electrode pattern and a second electrode pattern electrically isolated from the first electrode pattern, and
      a second metal layer disposed under the bottom surface;
   a first LED chip disposed on the first electrode pattern;
   a first phosphor disposed on the first LED chip;
   a second LED chip disposed on the second electrode pattern;
   a second phosphor disposed on the second LED chip;
   a dam disposed on the first metal layer and surrounding the first LED chip and the second LED chip; and
   an encapsulation layer disposed in the dam and covering the first and second LED chips and the first and second phosphors.

2. The luminescence device of claim 1, wherein the encapsulation layer further comprises a phosphor.

3. The luminescence device of claim 1, further comprising a metal layer disposed between the first electrode pattern and the first LED chip.

4. The luminescence device of claim 3, wherein the metal layer comprises Au.

5. The luminescence device of claim 1, wherein each of the first and second phosphors comprises at least one of a silicate based phosphor, a sulfide based phosphor, a YAG based phosphor, a TAG based phosphor or a nitride based phosphor.

6. The luminescence device of claim 1, wherein the dam is an insulation material.

7. The luminescence device of claim 1, wherein a top surface of the dam is higher than that of the first and second phosphors.

8. The luminescence device of claim 1, further comprising a wire electrically connecting the first LED chip with the second electrode pattern.

9. The luminescence device of claim 1, wherein the encapsulation layer comprises an upper surface being flat.

10. A luminescence device comprising:
  a substrate comprising
    a substrate body including a top surface and a bottom surface,
    a first metal layer disposed on the top surface and including a first electrode pattern and a second electrode pattern electrically isolated from the first electrode pattern, and
    a second metal layer disposed under the bottom surface;
  a first LED chip disposed on the first electrode pattern;
  a first phosphor disposed on the first LED chip;
  a second LED chip disposed on the second electrode pattern;
  a second phosphor disposed on the second LED chip;
  a dam disposed on the first metal layer and surrounding the first LED chip and the second LED chip; and
  a reflection prevention unit disposed on the dam and spaced from the first and second phosphors.

11. The luminescence device of claim 10, further comprising a metal layer disposed between the first electrode pattern and the first LED chip.

12. The luminescence device of claim 11, wherein the metal layer comprises Au.

13. The luminescence device of claim 10, wherein the reflection prevention unit comprises a reflection preventing glass.

14. The luminescence device of claim 10, wherein each of the first and second phosphors comprises at least one of a silicate based phosphor, a sulfide based phosphor, a YAG based phosphor, a TAG based phosphor or a nitride based phosphor.

15. The luminescence device of claim 10, wherein the dam is insulation material.

16. The luminescence device of claim 10, a top surface of the dam is higher than that of the first and second phosphors.

17. The luminescence device of claim 10, further comprising a wire electrically connecting the first LED chip with the second electrode pattern.

18. A luminescence device comprising:
  a substrate comprising
    a substrate body including a top surface and a bottom surface,
    a first metal layer disposed on the top surface and including a first electrode pattern and a second electrode pattern electrically isolated from each other, and
    a second metal layer disposed under the bottom surface;
  a first LED chip and a second LED chip disposed on the first and second electrode patterns;
  a dam disposed on the first metal layer and surrounding the first and second LED chips; and
  a film disposed on the dam and spaced from the first and second LED chips,
  wherein a maximum width of a light emitting area for the first and second LED chips is less than a maximum width of the dam.

19. The luminescence device of claim 18, further comprising a phosphor disposed on each of the first and second LED chips.

20. The luminescence device of claim 18, further comprising an encapsulation layer disposed in the dam, disposed under the film, and covering the first and second LED chips.

* * * * *